(12) United States Patent
Cheng et al.

(10) Patent No.: US 10,890,607 B2
(45) Date of Patent: Jan. 12, 2021

(54) SENSE CIRCUIT FOR PIEZORESISTIVE SENSOR, CIRCUIT INCLUDING ARRAY OF PIEZORESISTIVE SENSORS, AND OPERATION METHOD THEREOF

(71) Applicant: BOE TECHNOLOGY GROUP CO., LTD., Beijing (CN)

(72) Inventors: Chihjen Cheng, Beijing (CN); Xiaoliang Ding, Beijing (CN); Pengpeng Wang, Beijing (CN); Xueyou Cao, Beijing (CN); Yuzhen Guo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 55 days.

(21) Appl. No.: 16/206,144

(22) Filed: Nov. 30, 2018

(65) Prior Publication Data
US 2019/0310296 A1     Oct. 10, 2019

(30) Foreign Application Priority Data

Apr. 4, 2018  (CN) .......................... 2018 1 0301783

(51) Int. Cl.
*G01R 27/26*   (2006.01)
*H03K 17/96*   (2006.01)

(52) U.S. Cl.
CPC ..... *G01R 27/2605* (2013.01); *H03K 17/9622* (2013.01)

(58) Field of Classification Search
CPC ............ G01R 27/2605; G01R 31/2829; G01R 19/16542; G01N 3/08
See application file for complete search history.

(56) References Cited

U.S. PATENT DOCUMENTS

| | | | | |
|---|---|---|---|---|
| 5,204,576 A | * | 4/1993 | Mitsuyasu | .......... F02D 41/2096 310/316.01 |
| 5,477,831 A | * | 12/1995 | Akaki | .................... H02N 2/067 123/490 |
| 7,104,139 B2 | * | 9/2006 | Gao | ........................ G01G 3/13 73/777 |

(Continued)

FOREIGN PATENT DOCUMENTS

CN     101806875 A     8/2010
CN     101900904 A     12/2010
(Continued)

OTHER PUBLICATIONS

First Office Action for CN Appl. No. 201810301783.5, dated Dec. 24, 2019.
(Continued)

*Primary Examiner* — Thang X Le
(74) *Attorney, Agent, or Firm* — Dinsmore & Shohl LLP

(57) ABSTRACT

A sense circuit for a piezoresistive sensor is provided that comprises: an energy storage circuit coupled to the piezoresistive sensor via a first node; a charge control circuit coupled to the first node and configured to charge the energy storage circuit to a predetermined potential; a discharge control circuit configured to allow the energy storage circuit to discharge through the piezoresistive sensor; and a readout circuit coupled to the first node and configured to output a sensed voltage based on a level of charges stored by the energy storage circuit.

11 Claims, 7 Drawing Sheets

(56) References Cited

U.S. PATENT DOCUMENTS

| | | | | |
|---|---|---|---|---|
| 2006/0036377 A1* | 2/2006 | Nishihara | ........... | G01F 23/2966 |
| | | | | 702/55 |
| 2007/0296307 A1* | 12/2007 | Fukagawa | .............. | H02N 2/067 |
| | | | | 310/316.03 |
| 2008/0072879 A1* | 3/2008 | Nagase | ............... | F02D 41/2096 |
| | | | | 123/494 |

FOREIGN PATENT DOCUMENTS

| CN | 104662430 A | 5/2015 |
|---|---|---|
| CN | 205139939 U | 4/2016 |

OTHER PUBLICATIONS

Second Office Action for CN Patent Application No. 201810301783.5 dated Sep. 1, 2020.

* cited by examiner

SENSE CIRCUIT FOR PIEZORESISTIVE SENSOR, CIRCUIT INCLUDING ARRAY OF PIEZORESISTIVE SENSORS, AND OPERATION METHOD THEREOF

CROSS-REFERENCE TO RELATED APPLICATIONS

The present application claims priority to Chinese Patent Application No. 201810301783.5, filed on Apr. 4, 2018, which is incorporated herein in its entirety by reference.

FIELD

The present disclosure relates to the field of sensing technologies for piezoresistive sensors, and in particular to a sense circuit for piezoresistive sensor, a circuit including an array of piezoresistive sensors, and an operation method thereof.

BACKGROUND

In the prior art, a method for sensing a piezoresistive array sensor is to sense with an active architecture, and another is to sense with a passive architecture. The passive architecture is more power-efficient than the active architecture.

Passive architectures typically comprise a selection transistor which is connected to the piezoresistive sensor and a resistive voltage amplifier. Since the piezoresistor is normally open when being sensed after being coupled to the amplifier, there normally be leakage current, thus the power consumption of the overall architecture is increased. In addition, the trace on the array substrate is coupled in series with the piezoresistive sensor, and the trace resistance is related to the length of the trace. In such a case, since there is a voltage drop on the trace, the output voltages measured at the near end and the distal end thereof are different, which may result in an erroneous test result.

SUMMARY

According to an aspect of the present disclosure, there is provided a sense circuit for a piezoresistive sensor that comprises: an energy storage circuit coupled to the piezoresistive sensor via a first node; a charge control circuit coupled to the first node and configured to charge the energy storage circuit to a predetermined potential; a discharge control circuit configured to allow the energy storage circuit to discharge through the piezoresistive sensor; and a readout circuit coupled to the first node and configured to output a sensed voltage based on a level of charges stored by the energy storage circuit.

In some embodiments, the piezoresistive sensor has a first end configured to receive a first voltage, the energy storage circuit has a first end configured to receive a second voltage, and a second end coupled to the first node, the charge control circuit is configured to charge the energy storage circuit such that the first node is charged to the predetermined potential; the discharge control circuit is coupled to the first node and a second end of the piezoresistive sensor, respectively, configured to control a discharge path for the energy storage circuit, which includes the piezoresistive sensor, to be turned on or off, so that the energy storage circuit can be discharged through the piezoresistive sensor in the case that the discharge path is turned on; and the readout circuit is coupled to the first node and configured to output a sensed voltage according to the level of the charges stored by the energy storage circuit in response to a sense control signal.

In some embodiments, the readout circuit comprises: a first switch transistor having a first end coupled to the first node, and a control end to receive the sense control signal; a first capacitive device having a first end coupled to a second end of the first switch transistor; and an operational amplifier having a first input coupled to the second end of the first switch transistor, a second input to receive a reference voltage, and an output coupled to a second end of the first capacitive device.

In some embodiments, the charge control circuit comprises: a second switch transistor having a first end coupled to the first node, a control end to receive a charge control signal, and a second end to receive a third voltage.

In some embodiments, the charge control circuit comprises: the first switch transistor; a fourth switch transistor having a first end coupled to the second end of the first switch transistor, and a second end coupled to the output of the operational amplifier, and a control end to receive the charge control signal.

In some embodiments, the energy storage circuit comprises a second capacitive device.

In some embodiments, the discharge control circuit comprises a third switch device having a first end coupled to a second end of the piezoresistive sensor, a second end coupled to the first node, and a control end to receive a discharge control signal.

In some embodiments, the discharge control circuit comprises a third switch device configured to turn on or turn off, under control of a discharge control signal, a discharge path for the energy storage circuit, the discharge path including the piezoresistive sensor.

In some embodiments, the discharge control circuit is further configured to control the discharge path for the energy storage circuit, which includes the piezoresistive sensor, to be turned on such that the energy storage circuit is discharged through the piezoresistive sensor for a predetermined time period.

According to an aspect of the present disclosure, there is provided a circuit comprising: a plurality of piezoresistive sensors arranged in an array; a plurality of the sense circuits according to claim 1, wherein each of the sense circuits corresponds to one piezoresistive sensor.

According to an aspect of the present disclosure, there is provided an operation method for a sense circuit for piezoresistive sensor, comprising steps of: S1) charging, by the charge control circuit, the first node to the predetermined potential in response to a charge control signal; S2) discharging, by the discharge control circuit, the energy storage circuit through the piezoresistive sensor, in response to a discharge control signal; S3) outputting, by the readout circuit, the sensed voltage based on a potential of the first node in response to a sense control signal.

In some embodiments, the piezoresistive sensor has a first end to receive a first voltage, wherein the readout circuit comprises: a first switch transistor having a first end coupled to the first node, and a control end to receive the sense control signal; a first capacitive device having a first end coupled to a second end of the first switch transistor; and an operational amplifier having a first input coupled to the second end of the first switch transistor, a second input to receive a reference voltage, and an output coupled to a second end of the first capacitive device; wherein the charge control circuit comprises: a second switch transistor having a first end coupled to the first node, a control end to receive the charge control signal, and a second end to receive a third voltage; wherein the discharge control circuit comprises: a third switch device having a first end coupled to a second end of the piezoresistive sensor, and a second end coupled to the first node, and a control end to receive the discharge control signal, wherein the step S1 comprises: setting the charge control signal at the control end of the second switch transistor to turn on the second switch transistor, and setting control signals at the control ends of the first switch transistor and the third switch transistor to turn off the first switch transistor and the third switch transistor, thereby charging, by the charge control circuit, the first node to the predetermined potential; wherein the step S2 comprises: setting the charge control signal at the control end of the second switch transistor to turn off the second switch transistor, setting the control signal at the control end of the first switch transistor to turn off the first switch transistor, and setting the control signal at the control end of the third switch transistor to turn on the third switch transistor, thereby discharging, by the discharge control circuit, the energy storage circuit via the piezoresistive sensor; wherein the step S3 comprises: setting the charge control signal at the control end of the second switch transistor to turn off the second switch transistor, setting the control signal at the control end of the first switch transistor to turn on the first switch transistor, and setting the control signal at the control end of the third switch transistor to turn off the third switch transistor, whereby outputting, by the readout circuit, the sensed voltage based on a potential at the first node.

In some embodiments, the piezoresistive sensor has a first end configured to receive a first voltage, wherein the readout circuit comprises: a first switch transistor having a first end coupled to the first node, and a control end to receive the sense control signal; a first capacitive device having a first end coupled to a second end of the first switch transistor; and an operational amplifier having a first input coupled to the second end of the first switch transistor, a second input to receive a reference voltage, and an output coupled to the second end of the first capacitive device; wherein the charge control circuit comprises: the first switch transistor; and a fourth switch transistor having a first end coupled to the second end of the first switch transistor, and a second end coupled to the output of the operational amplifier, and a control end to receive the charge control signal; wherein the discharge control circuit comprises: a third switch device having a first end coupled to a second end of the piezoresistive sensor, a second end coupled to the first node, and a control end to receive the discharge control signal, wherein the step S1 comprises: setting the charge control signal at the control end of the second switch transistor such that the second switch transistor is turned on, setting a control signal for the first switch transistor to turn on the first switch transistor, and setting a control signal at the control end of the third switch transistor such that the third switch transistor is turned off, thereby charging the first node to the predetermined potential through the charge control circuit; wherein the step S2 comprises: setting the control signal at the control end of the first switch transistor to turn off the first switch transistor, and setting the control signal at the control end of the third switch transistor to turn on the third switch transistor, thereby discharging, by the discharge control circuit, the energy storage circuit through the piezoresistive sensor; wherein the step S3 comprises: setting the charge control signal at the control end of the second switch transistor to turn off the second switch transistor, setting the control signal at the control end of the first switch transistor to turn on the first switch transistor, and setting the control signal at the control end of the third switch transistor to turn off the third switch transistor, thereby sensing a potential of the first node and outputting the sensed voltage, by the readout circuit.

In some embodiments, in step S2, the energy storage circuit is caused by the discharge control circuit to discharge via the piezoresistive sensor for a predetermined time period.

The technical solutions provided by the embodiments or aspects of the present disclosure are devised with simplified structures, and low-power conversion circuits for piezoresistive sensor are obtained with use of the switching of the switches. These solutions are more power-efficient than the conventional passive architectures. According to the embodiments of the present disclosure, transferring of charges is employed during the sensing process, thus the error caused by the trace resistance in the conventional structures can also be avoided. According to the embodiments of the present disclosure, the detection result can be more accurate.

BRIEF DESCRIPTION OF THE DRAWINGS

The specific embodiments of the present disclosure will be further described in detail below with reference to the accompanying drawings, in which.

DETAILED DESCRIPTION OF ILLUSTRATIVE EMBODIMENTS

Figure 1:
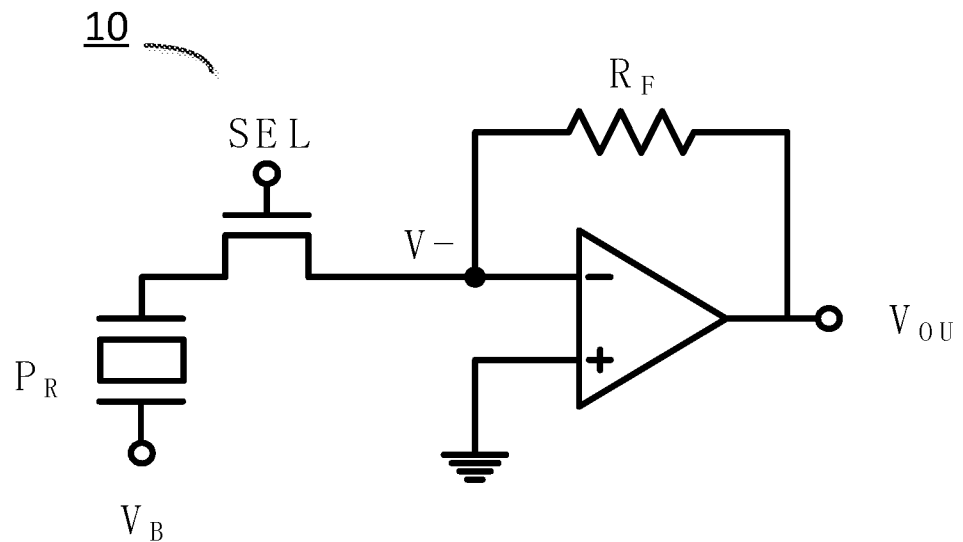
FIG. 1 shows a schematic diagram of a conventional passive sense circuit for piezoresistive sensor.

In order to describe the present disclosure more clearly, the present disclosure will be further described below in conjunction with the embodiments and the accompanying drawings. Similar or like components/items in the drawings are denoted with like reference numerals. It should be understood that the following detailed descriptions are illustrative and not for limiting, the scope of the disclosure.

FIG. 1 shows a schematic diagram of a conventional passive sense circuit for piezoresistive sensor. As shown in FIG. 1, the sense circuit 10 with a passive architecture generally comprises a selection transistor (SEL TFT) that is connected to the piezoresistive sensor $P_R$ and a resistive voltage amplifier. Assuming that the resistance value of $P_R$ is $R_X$, the output $V_{OU}$ is $(R_F/R_X) \times V_B$. However, since the piezoresistor is always-on in the detection after being connected to the amplifier, there is always a leakage current. Taking N columns of the sensors as an example, the overall leakage current will be $N \times V_B/R_X$.

In addition, the trace (not shown) on or in the array substrate generally is serially coupled to the $P_R$ (e.g., serially coupled between the upper terminal of the $P_R$ and node V−). The trace resistance is related to the length of the trace. Since there is a voltage drop across the trace, the output voltages measured at the near and distal ends thereof may be different, which will result in erroneous detection results.

Figure 2:
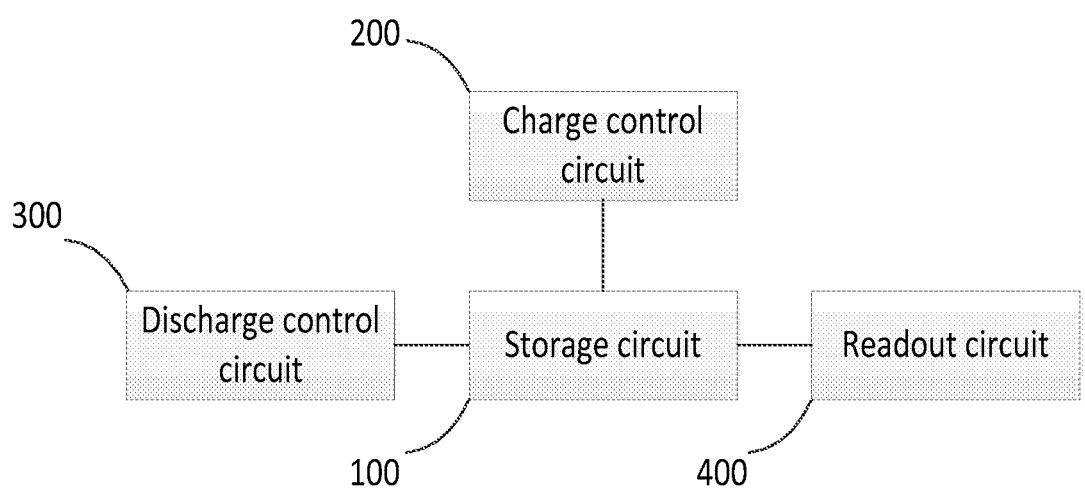
FIG. 2 shows a schematic block diagram of a sense circuit for piezoresistive sensor in accordance with an embodiment of the present disclosure.
Figure 3:
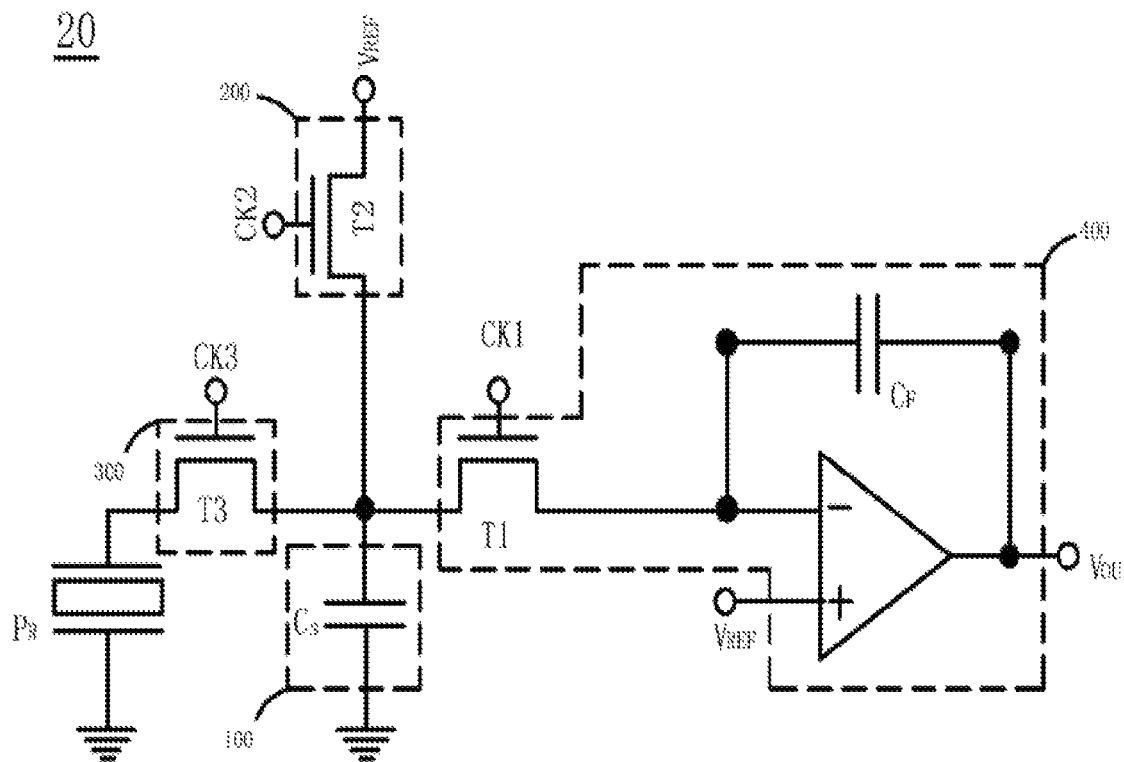
FIG. 3 illustrates a schematic diagram of a sense circuit for piezoresistive sensor in accordance with an embodiment of the present disclosure; FIG.

FIG. 2 shows a block diagram of a sense circuit for piezoresistive sensor in accordance with an embodiment of the present disclosure. The sense circuit for piezoresistive sensor is coupled to the piezoresistive sensor. As shown in FIG. 2, The sense circuit may include an energy storage circuit 100, a charge control circuit 200, a discharge control circuit 300, and a readout circuit 400. The energy storage circuit 100 can be coupled to the piezoresistive sensor $P_R$, for example, via a first node A, as shown in FIG. 3. The charge control circuit 200 can be coupled to the first node and configured to charge the energy storage circuit to a predetermined potential. The discharge control circuit 300 can be configured to allow the energy storage circuit to discharge through the piezoresistive sensor. The readout circuit 400 can be coupled to the first node and output a sensed voltage according to the level of the charges stored by the energy storage circuit.

In an embodiment as shown in FIG. 3, the sense circuit for piezoresistive sensor 20 is coupled to the piezoresistive sensor $P_R$. A first end of the piezoresistive sensor $P_R$ is used for receiving a first voltage. In the specific example of FIG. 3, the first end of the $P_R$ is grounded, i.e., the first voltage is about 0V. Those skilled in the art will readily understand that the first voltage is not limited thereto, and can be of another value than 0.

A first end of the energy storage circuit 100 can be used to receive a second voltage. In the specific example of FIG. 3, the first end of the energy storage circuit 100 is grounded, i.e., the second voltage is about 0V. Those skilled in the art will readily understand that the second voltage is not limited thereto, and can be of another value than 0.

In the specific example shown in FIG. 3, the energy storage circuit 100 may comprise a capacitive device, specifically a capacitor $C_S$. However, it will be understood by those skilled in the art from the following description that the energy storage circuit can be constructed with any capacitive device having a charge and discharge function or a circuit that exhibits capacitive as a whole, which is within the scope of the present application.

The charge control circuit 200 is coupled to the second end of the energy storage circuit 100 (e.g., via node A). The charge control circuit 200 is configured to receive a third voltage, and control a charging process of the energy storage circuit in response to a charge control signal to charge the second end of the energy storage circuit to a predetermined potential.

In the specific example shown in FIG. 3, the charge control circuit 200 includes a switch transistor T2 having a first end coupled to the second end of the capacitor $C_S$ and a second end to receive a third voltage (for example, VREF as shown in the figure).

However, those skilled in the art will readily understand that the third voltage can be other voltages as long as it can make the $C_S$ be charged to a predetermined potential.

The control end of the switch transistor T2 receives a charge control signal, such as the clock signal CK2 as shown in the figure.

The discharge control circuit 300 is electrically coupled to the second end (node A) of the energy storage circuit 100 and the second end of the piezoresistive sensor $P_R$, respectively. The discharge control circuit 300 can be configured to control the energy storage circuit and the piezoresistive sensor to be connected or disconnected in response to the discharge control signal, to cause the energy storage circuit to be discharged to the piezoresistive sensor during a preset time period.

In the specific example shown in FIG. 3, the discharge control circuit 300 may include a switch transistor T3 having a first end electrically coupled to a second end of the piezoresistive sensor $P_R$, a second end electrically coupled to a second end of the capacitor $C_S$, and a control end to receive a charge control signal such as the clock signal CK3 as shown in the figure.

The readout circuit 400 is coupled to the second end (node A) of the energy storage circuit 100, configured to receive a reference voltage, and output a sensed voltage in response to the sense control signal.

In the specific example shown in FIG. 3, the readout circuit 400 may include a switch transistor T1 a first end of which is coupled to the second end of the capacitor $C_S$, and a control end of which receives the sense control signal, such as the clock signal CK1 as shown in the figure.

The readout circuit 400 may further include a capacitive device $C_F$ (illustrated as a capacitor in the figure), a first end of the first capacitive device being coupled to the second end of the first switch transistor T1.

The readout circuit 400 may further include an operational amplifier. A first input of the operational amplifier is coupled to the second end of the switch transistor T1, a second input of the operational amplifier receives the reference voltage, and an output of the operational amplifier is coupled to the second end of the first capacitive device.

In the specific example shown in FIG. 3, the reference voltage is VREF, which can be set to be the same as the third voltage received by the switch transistor T2. In this case, the reference voltage and the third voltage can come from a same voltage source, which can simplify the design and reduce the fabrication process steps, and eliminate the need to separately distribute the voltage source.

Next, an operation method of the sense circuit according to an embodiment of the present disclosure will be described with reference to FIGS. 3-7.

In some embodiments, the operation method may include the following steps. In step S1: the first node is charged to the predetermined potential by the charge control circuit in response to the charge control signal. In step S2: in response to the discharge control signal, the discharge control circuit makes the energy storage circuit to discharge through the piezoresistive sensor. In step S3: responsive to the sense control signal, the readout circuit senses the potential of the first node and outputs the sensed voltage.

In some more specific embodiments, in the step S1, the second end of the energy storage circuit 100 is charged to a predetermined potential by the charge control circuit 200 in response to the charge control signal. Therefore, the phase corresponding to this step can also be referred to as potential reset phase.

Figure 4:
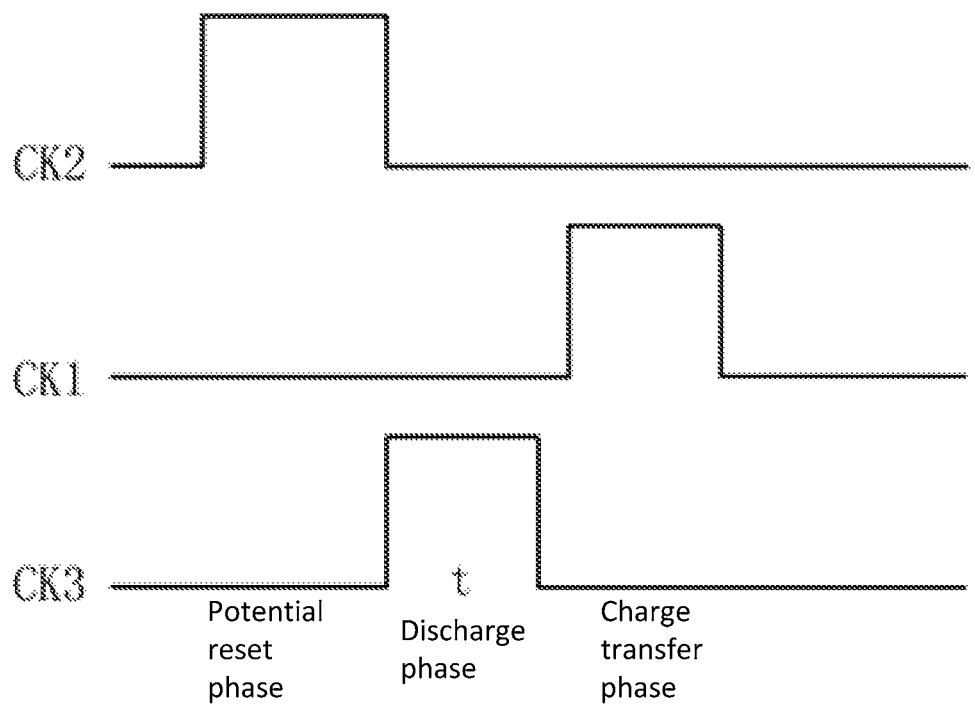
FIG. 4 illustrates control timing of a sense circuit for piezoresistive sensor in accordance with an embodiment of the present disclosure.
Figure 5:
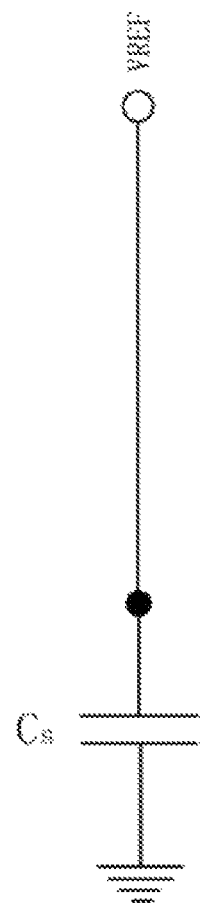
FIG. 5 is an equivalent circuit diagram of a sense circuit in a potential reset phase in accordance with an embodiment of the present disclosure.

As shown in FIG. 4, the charge control signal CK2 at the control end of the switch transistor T2 is at a high level, and the clock signals CK1 and CK3 at the control ends of the switch transistors T1 and T3 are at a low level, thus the switch transistor T2 is turned on, and the switch transistors T1 and T3 are turned off a simplified equivalent circuit for the sense circuit in this phase is shown in FIG. 5. The second end of capacitor Cs is charged to a predetermined potential, such as the voltage VREF. In other words, node A is charged to the predetermined potential.

In some more specific embodiments, in step S2: in response to the discharge control signal, the discharge control circuit 300 causes the energy storage circuit 100 to be discharged via the piezoresistive sensor P$_R$ for a predetermined period of time. Therefore, the phase corresponding to this step can also be referred to as discharge phase.

Figure 6:
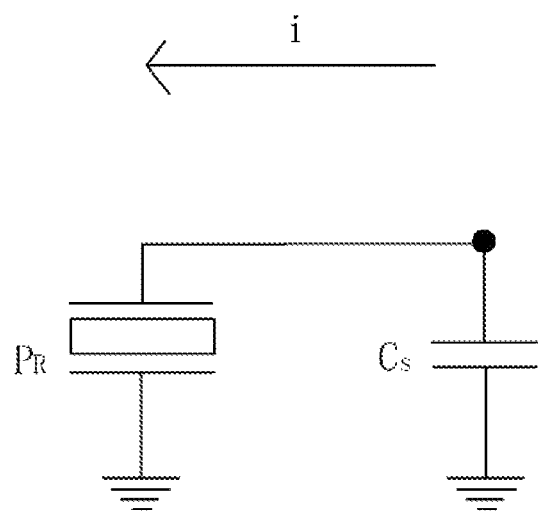
FIG. 6 is an equivalent circuit diagram of a sense circuit in a discharge phase in accordance with an embodiment of the present disclosure.

As shown in FIG. 4, the charge control signal CK2 at the control end of the switch transistor T2 is at a low level, the clock signal CK1 at the control end of the switch transistor T1 is at a low level, and the clock signal CK3 at the control end of the switch transistor T3 is at a high level, thus the switch transistor T2 is turned off, T1 is turned off, and T3 is turned on. And, a simplified equivalent circuit of the sense circuit in this phase is shown in FIG. 6. The capacitor Cs is discharged through the piezoresistive sensor P$_R$ for a time t. And in some embodiments, the minimum value of t can be set to correspond to the minimum accuracy with which presses can be identified. The voltage Vt at the second end of the capacitor Cs is VREF×exp(−t/(Rx*C1)), where Rx is the piezoresistive value of the piezoresistive sensor and C1 is the capacitance value of the capacitor Cs. The potential of the capacitor Cs is lowered after the end of the discharging, but is not equal to zero.

In some more specific embodiments, in step S3: in response to the sense control signal, the readout circuit 400 outputs a sensed voltage based on the potential of the second end of the energy storage circuit 100.

Figure 7:
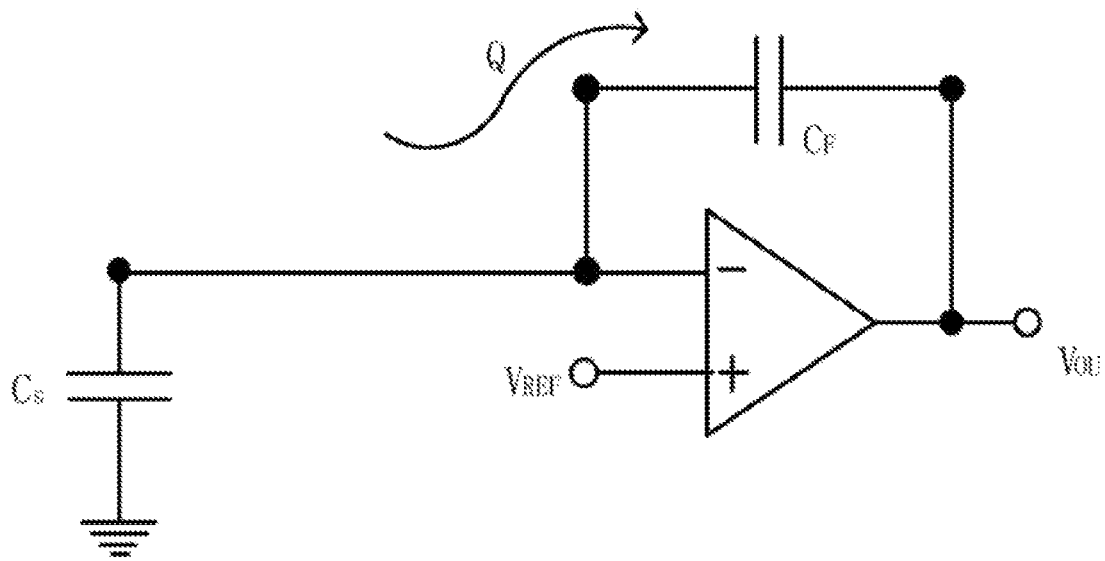
FIG. 7 is an equivalent circuit diagram of discharge phase in a charge transfer phase in accordance with an embodiment of the present disclosure.

As shown in FIG. 4, the charge control signal CK2 at the control end of the switch transistor T2 is at a low level, the clock signal CK1 at the control end of the switch transistor T1 is at a high level, and the clock signal CK3 at the control end of the switch transistor T3 is at a low level, thus the switch transistor T2 is turned off, T1 is turned on, and T3 is turned off. And, a simplified equivalent circuit is shown in FIG. 7. The charge Q remaining on the capacitor Cs is transferred to the capacitor C$_F$.

In this phase, the capacitor Cs and C$_F$ are coupled in series, and Vou=C1/C2×exp(−t/(Rx*C1))×VREF, where C2 is the capacitance value of the capacitor C$_F$.

When the piezoresistive sensor is pressed, the piezoresistive resistance of the piezoresistive sensor changes, that is, Rx changes, thus the voltage at the second end (node A) of the capacitor Cs changes, and the sensed voltage Vou changes. Thereby, the magnitude of the pressure can be determined by Vou.

A person skilled in the art will readily understand that the switch transistors in the above embodiment are configured to be turned on with a high level, and turned off with a low level; that is, the switch transistors are N-type transistors. However, the present disclosure shall not be limited thereto, and P-type transistors can also be used; in such a case, the polarities of the timing signals shown in FIG. 4 may be inverted.

In addition, the switch transistors in this embodiment may be TFT transistors, and in such a case, the control end is a gate, the first end is a source (or a drain), and the second end is a drain (or a source).

Comparing the circuit configuration of the embodiment of the present application to the prior art shown in FIG. 1, and assuming that a same pressing pressure is applied, the changes in Rx are the same, and the VREF in the embodiment of the present disclosure is equal to the voltage V$_B$ at the first end of the P$_R$ in FIG. 1, that is, both the initial current values for the embodiment of the present application and the prior art shown in FIG. 1 are the same. As can be seen from FIG. 8, the circuit architecture of the embodiment of the present application is more power-saving, thereby the overall power consumption of the circuit can be reduced.

Figure 9:
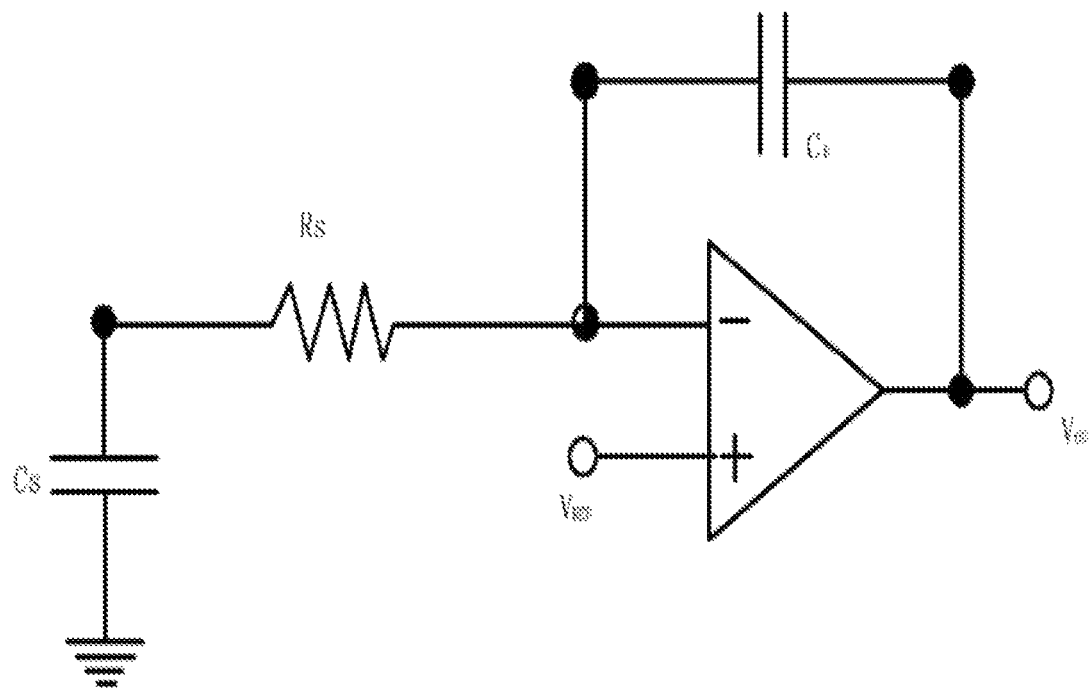
FIG. 9 is an equivalent circuit diagram of a sense circuit in consideration of a trace resistance in accordance with an embodiment of the present disclosure.

In addition, FIG. 9 illustrates a simplified equivalent circuit of the sense circuit of the above embodiments of the present disclosure in the charge transfer phase in consideration of the trace resistance, wherein the trace resistor is represented by R$_S$ and is coupled between the second end of the capacitor Cs and the first end of the capacitor C$_F$.

The potential of the second end of the capacitor Cs is changed by ΔV by pressing, and when the switch transistor T1 is turned on, Vt=Vcs≠VREF. The operational amplifier charges Cs through C$_F$ and eventually equilibrium is obtained again, i.e., Vt=Vcs=VREF. And, the Vou is changed in accordance with the change in the amount of the charges, i.e., ΔQ (basically equal to Cs×ΔV) due to the charging, that is, ΔVou=ΔQ/C2=C1/C2×ΔV. It can be seen that ΔVou is irrelevant with the trace resistance. Due to the charge transfer scheme, errors caused by trace resistance can be alleviated or avoided.

Figure 10:
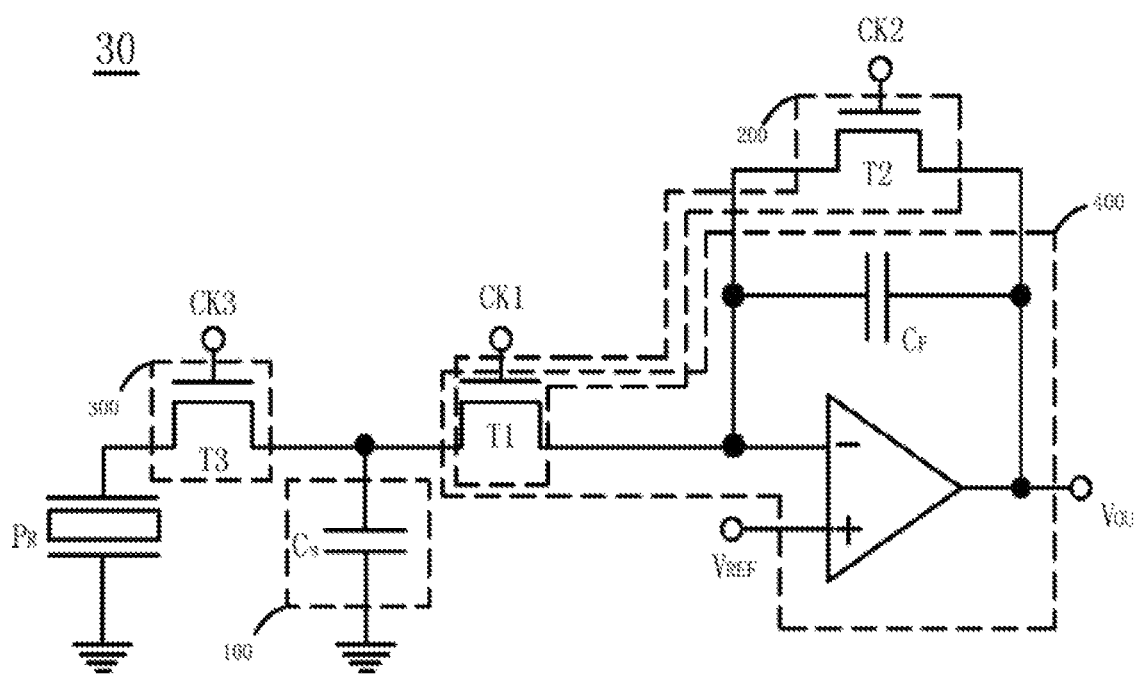
FIG. 10 shows a schematic diagram of a sense circuit for piezoresistive sensor in accordance with an alternative embodiment of the present disclosure.

Another embodiment of the present disclosure provides a sense circuit for piezoresistive sensor as an alternative to the embodiment of FIG. 3. FIG. 10 shows a schematic diagram of a sense circuit for piezoresistive sensor in accordance with another embodiment of the present disclosure. As shown in FIG. 10, the sense circuit for piezoresistive sensor 30 is configured to be connected to the piezoresistive sensor P$_R$, and a first end of the piezoresistive sensor P$_R$ is configured to receive the first voltage.

In the specific example of FIG. 10, the first end of the P$_R$ is grounded, that is, the first voltage is 0 V. Those skilled in the art will readily understand that the first voltage is not limited thereto.

The sense circuit for piezoresistive sensor 30 includes an energy storage circuit 100, a charge control circuit 200, a discharge control circuit 300, and a readout circuit 400.

The first end of the energy storage circuit 100 is configured to receive a second voltage. In the specific example of FIG. 9, the first end of the energy storage circuit 100 is grounded, i.e., the second voltage is 0 V. Those skilled in the art will readily understand that the second voltage is not limited thereto.

In the specific example shown in FIG. 10, the energy storage circuit 100 includes a capacitor Cs. However, it will be understood by those skilled in the art from the following description that the energy storage circuit can be constructed by any capacitive device having a charge and discharge function or a circuit that exhibits capacitive as a whole, which is intended to be embraced within the scope of the present application.

The charge control circuit 200 is coupled to a second end of the energy storage circuit 100, configured to receive a third voltage, and control a charging process of the energy storage circuit in response to a charge control signal to charge the second end of the energy storage circuit to a predetermined potential.

In the specific example shown in FIG. 10, the charge control circuit 200 includes a switch transistor T1 and a switch transistor T2.

The first end of the switch transistor T1 is coupled to the second end of the capacitor Cs, and the control end of the switch transistor T1 receives a control signal, such as the clock signal CK1 as shown in the figure.

The first end of the switch transistor T2 is coupled to the second end of the switch transistor T1, and the control end of the switch transistor T2 receives a charge control signal, that is, the clock signal CK2 as shown in the figure.

In the example of FIG. 10, the second end of the switch transistor T2 is coupled to the output of the operational amplifier. In other embodiments, the second end of switch transistor T2 can receive a third voltage, such as VREF. In this case, it is not necessary to separately supply a voltage source to the switch transistor T2, which can reduce the number of the processes.

The discharge control circuit 300 is electrically coupled to the second end of the energy storage circuit 100 and the second end of the piezoresistive sensor PR, respectively, and configured to control, in response to the discharge control signal, the energy storage circuit and the piezoresistive sensor to be connected or disconnected, so that the energy storage circuit can discharges via the piezoresistive sensor for a preset period of time.

In the specific example shown in FIG. 10, the discharge control circuit 300 includes a switch transistor T3 having a first end electrically coupled to a second end of the piezoresistive sensor PR, a second end electrically coupled to a second end of the capacitor Cs, and a control end to receive the charge control signal, such as, the clock signal CK3 as shown in the figure.

The readout circuit 400 is coupled to the second end of the energy storage circuit 100, configured to receive a reference voltage, and output a sensed voltage in response to the sense control signal.

In the specific example shown in FIG. 10, the readout circuit 400 includes the switch transistor T1, that is, in the example of FIG. 10, the readout circuit 400 and the charge control circuit 200 share the switch transistor T1.

The readout circuit 400 further includes a first capacitive device CF (illustrated as a capacitor in the figure), the first end of the first capacitive device being coupled to the second end of the switch transistor T1.

The readout circuit 400 further includes an operational amplifier in which the first input of the operational amplifier is coupled to the second end of the switch transistor T1, the second input of the operational amplifier receives a reference voltage, and the output of the operational amplifier is coupled to the second end of the first capacitive device. In the specific example shown in FIG. 10, the reference voltage is VREF.

Next, an operation method of an alternative embodiment of the present disclosure will be described with reference to FIGS. 10-14. The method may include some or all of the following steps, according to various implementations.

In step S1 (e.g., potential reset phase): the second end of the energy storage circuit 100 is charged to a predetermined potential by the charge control circuit 200 in response to the charge control signal.

Figure 11:
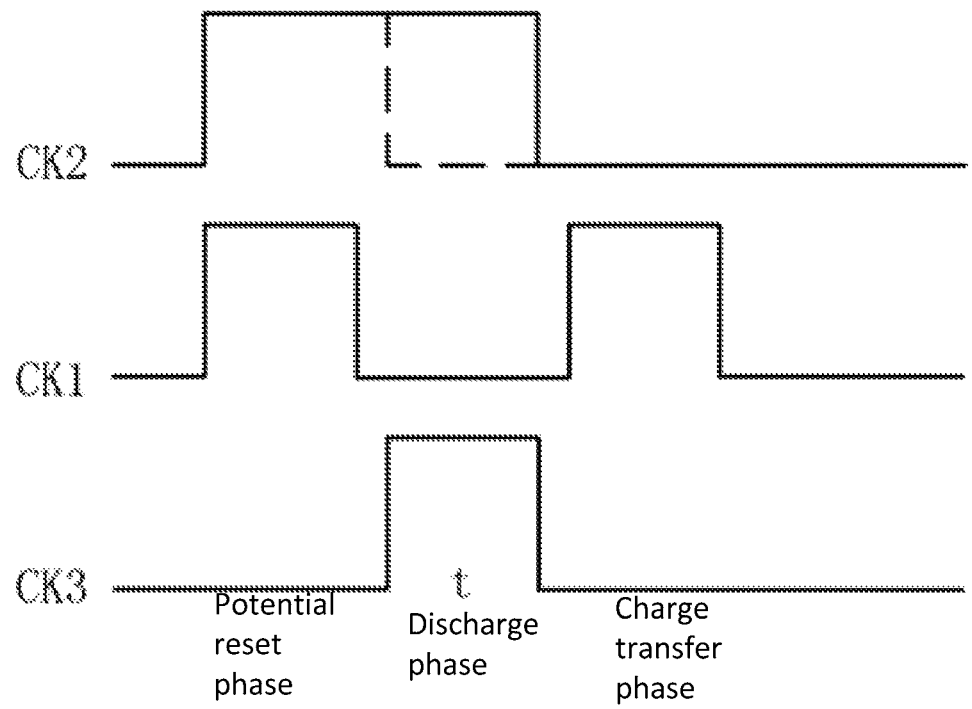
FIG. 11 illustrates control timing of a sense circuit for piezoresistive sensor in accordance with an alternative embodiment of the present disclosure.
Figure 12:
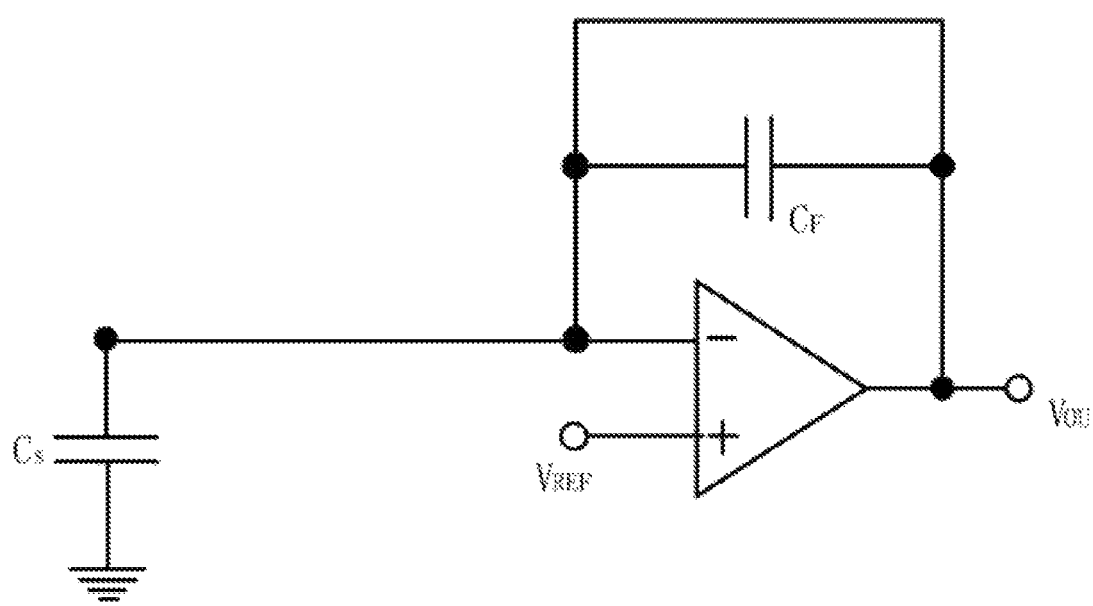
FIG. 12 is an equivalent circuit diagram of a sense circuit in a potential reset phase in accordance with an alternate embodiment of the present disclosure.

As shown in FIG. 11, the charge control signal CK2 at the control end of the switch transistor T2 is at a high level, the clock signal CK1 at the switch transistor T1 is at a high level, and the clock signal CK3 at the control end of the switch transistor T3 is at a low level. Thus, the switch transistors T1 and T2 are turned on, and T3 is turned off, and a simplified equivalent circuit is as shown in FIG. 12. The second end of the capacitor Cs is charged through the virtual short-circuiting by the operational amplifier to a predetermined potential, that is, the potential VREF at the second input terminal of the operational amplifier.

In step S2 (e.g., discharge phase): in response to the discharge control signal, the discharge control circuit 300 causes the energy storage circuit 100 to discharge via the piezoresistive sensor PR for a predetermined period of time.

Figure 13:
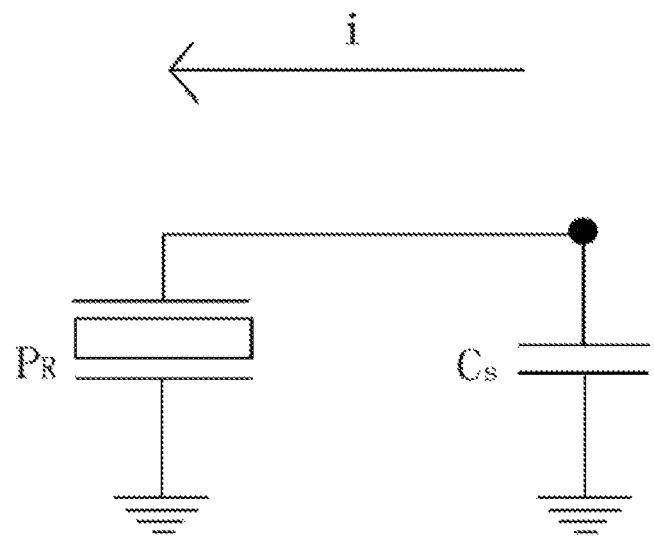
FIG. 13 is an equivalent circuit diagram of a sense circuit in a discharge phase in accordance with an alternate embodiment of the present disclosure.

As shown in FIG. 11, the charge control signal CK2 at the control end of the switch transistor T2 can be at a low level (as indicated by a broken line) or a high level (as indicated by a solid line), the clock signal CK 1 at the control end of the switch transistor T1 is at a low level and the clock signal CK3 at the control end of the switch transistor T3 is at a high level, thus the switch transistor T2 can be turned off (or turned on), T1 is turned off, and T3 is turned on, and a simplified equivalent circuit is shown in FIG. 13. The capacitor Cs discharges via the piezoresistive sensor PR for the time t. In some embodiments, the minimum value of t is set to correspond to the minimum accuracy with which presses can be identified. The voltage Vt of the second end of the capacitor Cs is VREF$\times$exp($-$t/(Rx*C1)), where Rx is the piezoresistive value of the piezoresistive sensor and C1 is the capacitance value of the capacitor Cs. The potential of the capacitor Cs is lowered after the end of the discharging, but is not equal to zero.

In step S3 (e.g., charge transfer phase): in response to the sense control signal, the readout circuit 400 senses a potential change at the second end of the energy storage circuit 100 and outputs a sensed voltage.

Figure 14:
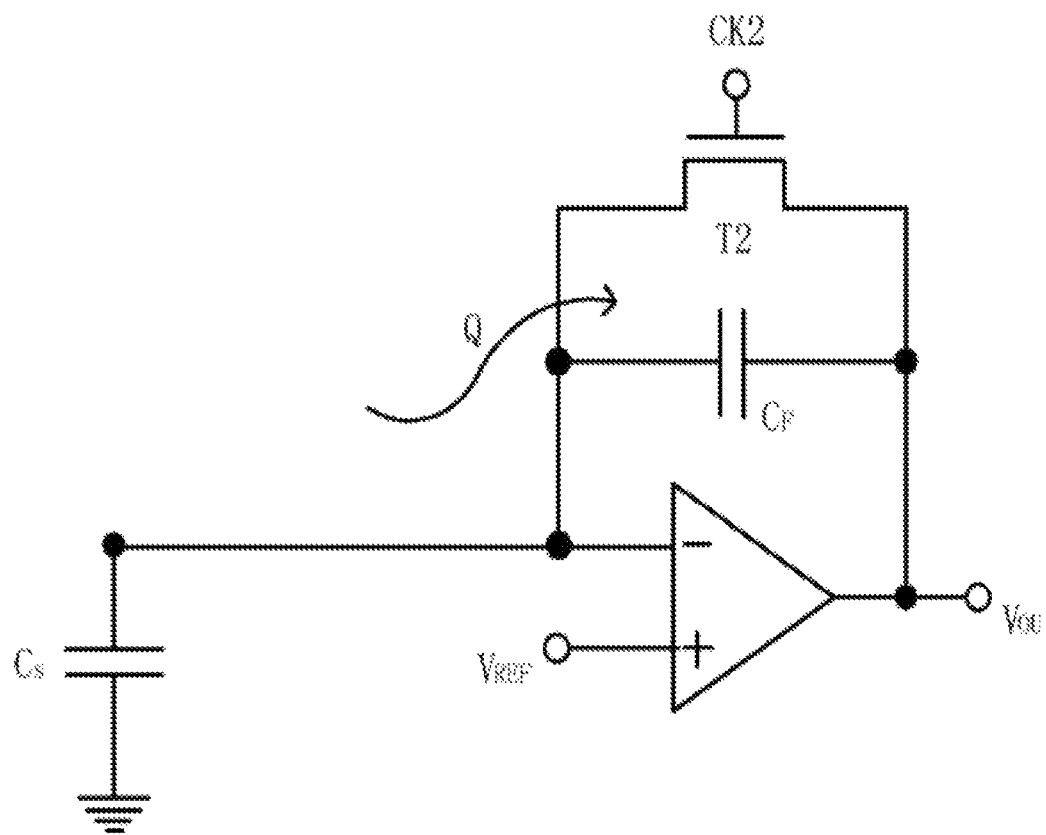
FIG. 14 is an equivalent circuit diagram of a sense circuit in a charge transfer phase in accordance with an alternate embodiment of the present disclosure.

As shown in FIG. 11, the charge control signal CK2 at the control end of the switch transistor T2 is at a low level, the clock signal CK1 at the control end of the switch transistor T1 is at a high level, and the clock signal CK3 at the control end of the switch transistor T3 is at a low level, thus, the switch transistor T2 is turned off, T1 is turned on, and T3 is turned off, and a simplified equivalent circuit is shown in FIG. 14. The charges Q remained on the capacitor Cs can be transferred to the capacitor CF.

In this phase, it is equivalent to that the capacitor Cs and CF are coupled in series, thus Vou=C1/C2$\times$exp($-$t/(Rx*C1))$\times$VREF, where C2 is the capacitance value of the capacitor CF.

When the piezoresistive sensor is pressed, the piezoresistive resistance of the piezoresistive sensor changes, that is, Rx changes, and the voltage at the second end of the capacitor Cs changes, and in turn the sensed voltage Vou changes. Thus, the magnitude of the pressure can be determined by the sensed voltage Vou.

A person skilled in the art will readily understand that the switch transistors in the above embodiment are turned on with a high level and turned off with the low level off, that is, the switch transistors can be N-type transistors. However, the disclosure is not limited thereto, and P-type transistors can also be used; in such a case, the polarities of the timing signals shown in FIG. 11 may be inverted.

In addition, the switch transistors in this embodiment may be TFT transistors. In such a case, the control end is a gate, the first end is a source (or a drain), and the second end is a drain (or a source).

Figure 8:
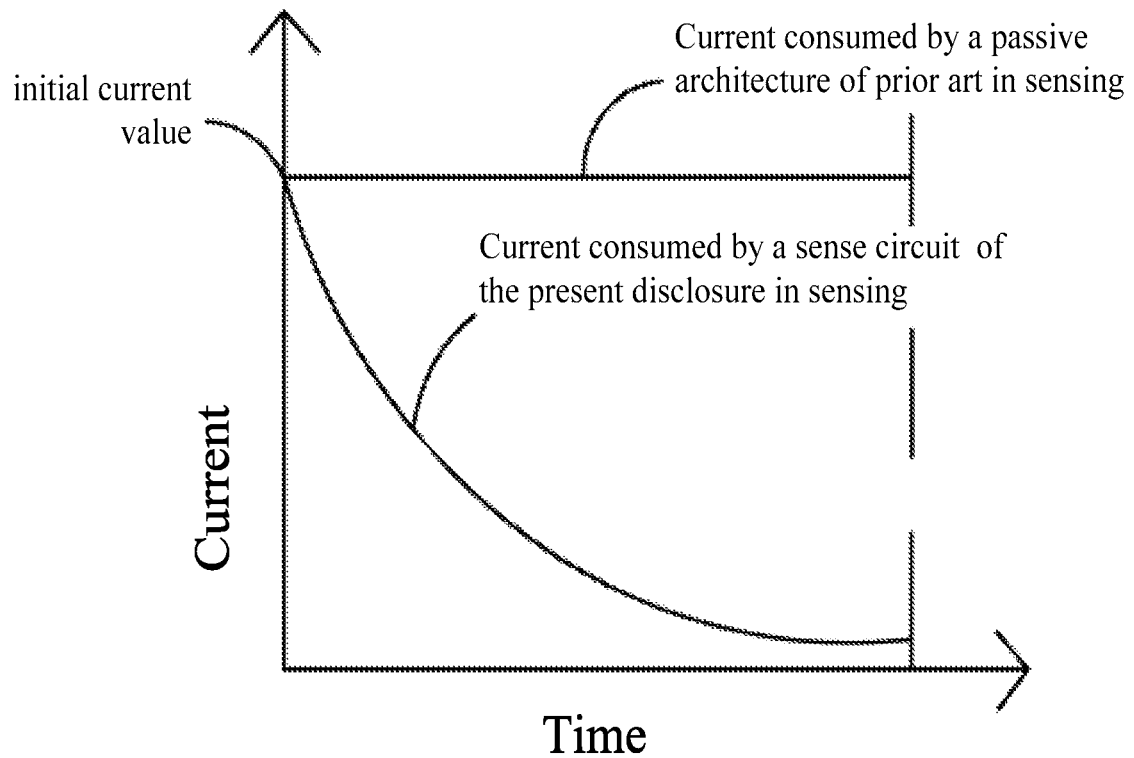
FIG. 8 is a comparison diagram of power consumptions of an embodiment of the present disclosure and a conventional sense circuit.

Similarly, the embodiment shown in FIG. 10 also has the effects shown in FIG. 8. Comparing the circuit configuration of the embodiment of the present application to the prior art shown in FIG. 1, and assuming that a same pressing pressure is applied, the changes in Rx are the same, and the VREF in the embodiment of the present disclosure is equal to the voltage VB at the first end of the PR in FIG. 1, that is, both the initial current values for the embodiment of the present application and the prior art shown in FIG. 1 are the same. As can be seen from FIG. 8, the circuit architecture as shown in FIG. 10 is more power-saving, thereby the overall power consumption of the circuit can be reduced.

An equivalent circuit of the embodiment shown in FIG. 10 in the charge transfer phase in consideration of the trace resistance is shown in FIG. 9, wherein the trace resistance is represented by Rs, and is coupled between the second end of the capacitor Cs and the first end of the capacitor CF.

The potential at the second end of the capacitor Cs is changed by $\Delta V$ due to pressing, and when the switch transistor T1 is turned on, Vt=Vcs≠VREF. The operational amplifier charges Cs through CF and eventually they reach equilibrium again, i.e., Vt=Vcs=VREF. And, the Vou is changed in accordance with the change in the amount of the charges, i.e., $\Delta Q$ (basically equal to Cs×$\Delta V$) due to the charging,, that is, $\Delta Vou=\Delta Q/C2=C1/C2\times\Delta V$. It can be seen that $\Delta Vou$ is irrelevant to the trace resistance. Due to the charge transfer scheme, errors caused by trace resistance can be avoided.

In addition, in the embodiment shown in FIG. 3, the third voltage received by the second end of the switch transistor T2 may be a voltage different from VREF, and in such a case, a separate voltage source is required for the switch transistor T2. In comparison, in the embodiment shown in FIG. 10, the second end of the switch transistor T2 is directly coupled to the output of the operational amplifier, and the received voltage is derived from the output of the operational amplifier. In this case, it not needed to separately provide a voltage source for the switch transistor T2, thus the process can be simplified. On basis of the sense circuits for piezoresistive sensor described above, for example, as shown in FIGS. 3 and 10, another aspect of the present disclosure provides a circuit including a plurality of piezoresistive sensors which can be arranged in an array, and a plurality of the sense circuits according to the embodiments above-mentioned. In some embodiments, each piezoresistive sensor can correspond to one sense circuit. The circuit with piezoresistive sensor array according to the present disclosure consumes less power than the existing piezoresistive sensor array circuit, and the error caused by the trace resistance can be avoided due to the charge transfer scheme.

It should be understood that although the embodiments are given by taking the piezoresistive sensor as an example here, the present disclosure shall not be limited thereto. The present disclosure can also be applied equally or adaptively to other types of sensors, such as piezoelectric sensors. Therefore, it is also contemplated that the piezoresistive sensors in the above mentioned or illustrated embodiments are replaced with piezoelectric sensors to form additional embodiments.

It is apparent that the above-described embodiments of the present disclosure are merely illustrative of the present disclosure, are not for enumerate all the possible embodiments, and are not intended to limit the scope of the present disclosure, either. It is apparent for those skilled in the art that various changes and modifications can be made on basis of the above descriptions without departing from the spirit and scope of the present disclosure, and therefore, they are intended to be embraced within the scope of the present disclosure.

What is claimed is:

1. A sense circuit for a piezoresistive sensor, comprising:
   an energy storage circuit coupled to the piezoresistive sensor via a first node;
   a charge control circuit coupled to the first node and configured to charge the energy storage circuit to a predetermined potential;
   a discharge control circuit configured to allow the energy storage circuit to discharge through the piezoresistive sensor; and
   a readout circuit coupled to the first node and configured to output a sensed voltage based on a level of charges stored by the energy storage circuit,
   wherein the piezoresistive sensor has a first end configured to receive a first voltage,
   the energy storage circuit has a first end configured to receive a second voltage, and a second end coupled to the first node,
   the charge control circuit is configured to charge the energy storage circuit such that the first node is charged to the predetermined potential;
   the discharge control circuit is coupled to the first node and a second end of the piezoresistive sensor, respectively, configured to control a discharge path for the energy storage circuit, which includes the piezoresistive sensor, to be turned on or off, so that the energy storage circuit can be discharged through the piezoresistive sensor in the case that the discharge path is turned on; and
   the readout circuit is coupled to the first node and configured to output the sensed voltage according to the level of the charges stored by the energy storage circuit in response to a sense control signal,
   wherein the readout circuit comprises:
   a first switch transistor having a first end coupled to the first node, and a control end to receive the sense control signal;
   a first capacitive device having a first end coupled to a second end of the first switch transistor; and
   an operational amplifier having a first input coupled to the second end of the first switch transistor, a second input to receive a reference voltage, and an output coupled to a second end of the first capacitive device.

2. The sense circuit of claim 1, wherein the charge control circuit comprises:
   a second switch transistor having a first end coupled to the first node, a control end to receive a charge control signal, and a second end to receive a third voltage.

3. The sense circuit of claim 1, wherein the charge control circuit comprises:
   the first switch transistor;
   a fourth switch transistor having a first end coupled to the second end of the first switch transistor, and a second end coupled to the output of the operational amplifier, and a control end to receive a charge control signal.

4. The sense circuit of claim 1, wherein the energy storage circuit comprises a second capacitive device.

5. The sense circuit of claim 1, wherein the discharge control circuit comprises a third switch device having a first end coupled to a second end of the piezoresistive sensor, a second end coupled to the first node, and a control end to receive a discharge control signal.

6. The sense circuit of claim 1, wherein the discharge control circuit comprises a third switch device configured to turn on or turn off, under control of a discharge control signal, a discharge path for the energy storage circuit, the discharge path including the piezoresistive sensor.

7. The sense circuit of claim 1, wherein the discharge control circuit is further configured to control the discharge path for the energy storage circuit, which includes the piezoresistive sensor, to be turned on such that the energy storage circuit is discharged through the piezoresistive sensor for a predetermined time period.

8. A circuit comprising:
a plurality of piezoresistive sensors arranged in an array;
a plurality of the sense circuits according to claim 1, wherein each of the sense circuits corresponds to one piezoresistive sensor of the plurality of piezoresistive sensors.

9. An operation method for a sense circuit for a piezoresistive sensor according to claim 1, comprising steps of:
S1) charging, by the charge control circuit, the first node to the predetermined potential in response to a charge control signal;
S2) discharging, by the discharge control circuit, the energy storage circuit through the piezoresistive sensor, in response to a discharge control signal;
S3) outputting, by the readout circuit, the sensed voltage based on a potential of the first node in response to a sense control signal,
wherein the piezoresistive sensor has a first end configured to receive a first voltage,
wherein the readout circuit comprises:
a first switch transistor having a first end coupled to the first node, and a control end to receive the sense control signal;
a first capacitive device having a first end coupled to a second end of the first switch transistor; and
an operational amplifier having a first input coupled to the second end of the first switch transistor, a second input to receive a reference voltage, and an output coupled to a second end of the first capacitive device;
wherein the charge control circuit comprises:
a second switch transistor having a first end coupled to the first node, a control end to receive the charge control signal, and a second end to receive a third voltage;
wherein the discharge control circuit comprises:
a third switch transistor having a first end coupled to a second end of the piezoresistive sensor, and a second end coupled to the first node, and a control end to receive the discharge control signal,
wherein the step S1 comprises:
setting the charge control signal at the control end of the second switch transistor to turn on the second switch transistor, and
setting control signals at the control ends of the first switch transistor and the third switch transistor to turn off the first switch transistor and the third switch transistor,
thereby charging, by the charge control circuit, the first node to the predetermined potential;
wherein the step S2 comprises:
setting the charge control signal at the control end of the second switch transistor to turn off the second switch transistor,
setting the control signal at the control end of the first switch transistor to turn off the first switch transistor, and
setting the control signal at the control end of the third switch transistor to turn on the third switch transistor,
thereby discharging, by the discharge control circuit, the energy storage circuit via the piezoresistive sensor;
wherein the step S3 comprises:
setting the charge control signal at the control end of the second switch transistor to turn off the second switch transistor,
setting the control signal at the control end of the first switch transistor to turn on the first switch transistor, and
setting the control signal at the control end of the third switch transistor to turn off the third switch transistor,
whereby outputting, by the readout circuit, the sensed voltage based on a potential at the first node.

10. The method of claim 9,
wherein the charge control circuit comprises:
the first switch transistor; and
a fourth switch transistor having a first end coupled to the second end of the first switch transistor, and a second end coupled to the output of the operational amplifier, and a control end to receive the charge control signal;
wherein the step S1 comprises:
setting a control signal for the first switch transistor to turn on the first switch transistor, and
wherein the step S3 comprises:
sensing a potential of the first node and outputting the sensed voltage, by the readout circuit.

11. The method according to claim 9, wherein in step S2, the energy storage circuit is caused by the discharge control circuit to discharge via the piezoresistive sensor for a predetermined time period.

* * * * *